(12) United States Patent
McGarvey et al.

(10) Patent No.: US 11,056,525 B2
(45) Date of Patent: Jul. 6, 2021

(54) SEMICONDUCTOR PHOTOMULTIPLIER

(71) Applicant: SensL Technologies LTD, County Cork (IE)

(72) Inventors: Brian McGarvey, Templemartin (IE); Stephen John Bellis, Rushbrooke (IE); John Carlton Jackson, Cobh (IE)

(73) Assignee: SensL Technologies LTD, County Cork (IE)

( * ) Notice: Subject to any disclaimer, the term of this patent is extended or adjusted under 35 U.S.C. 154(b) by 349 days.

(21) Appl. No.: 15/335,658

(22) Filed: Oct. 27, 2016

(65) Prior Publication Data

US 2017/0047372 A1 Feb. 16, 2017

Related U.S. Application Data

(62) Division of application No. 14/577,123, filed on Dec. 19, 2014, now abandoned.

(51) Int. Cl.
*H01L 27/144* (2006.01)
*H01L 23/48* (2006.01)
(Continued)

(52) U.S. Cl.
CPC ...... *H01L 27/14643* (2013.01); *H01L 23/481* (2013.01); *H01L 27/1443* (2013.01); *H01L 27/1446* (2013.01); *H01L 27/14603* (2013.01); *H01L 27/14609* (2013.01); *H01L 27/14634* (2013.01); *H01L 27/14636* (2013.01);
(Continued)

(58) Field of Classification Search
CPC ............. H01L 23/481; H01L 27/14603; H01L 27/14636; H01L 27/1446; H01L 27/14643–14663; H01L 21/76898; H01L 31/02002; H01L 31/02005; H01L 31/107; H01L 27/14609; H01L 27/1443; H01L 28/20; G01J 2001/4466
See application file for complete search history.

(56) References Cited

U.S. PATENT DOCUMENTS 7,691,748 B2 4/2010 Han
2004/0229398 A1\* 11/2004 Magerlein ............. H01L 23/147
438/106

(Continued)

FOREIGN PATENT DOCUMENTS

WO 2011117309 A3 3/2012
WO WO-2014129507 A1 \* 8/2014 ............. G01T 1/241

OTHER PUBLICATIONS

"Non-final Rejection dated Apr. 29, 2016," U.S. Appl. No. 14/577,123, filed Dec. 19, 2014, 11 pages.

*Primary Examiner* — Yu Chen
(74) *Attorney, Agent, or Firm* — Polansky & Associates, P.L.L.C.; Paul J. Polansky

(57) ABSTRACT

The present disclosure relates to a semiconductor photomultiplier comprising a a substrate; an array of photosensitive elements formed on a first major surface of the substrate; a plurality of primary bus lines interconnecting the photosensitive elements; at least one segmented secondary bus line provided on a second major surface of the substrate which is operably coupled to one or more terminals; and multiple vertical interconnect access (via) extending through the substrate operably coupling the primary bus lines to the at least one segmented secondary bus line.

17 Claims, 10 Drawing Sheets

(51) Int. Cl.
*H01L 27/146* (2006.01)
*H01L 31/107* (2006.01)
*H01L 49/02* (2006.01)
*G01J 1/44* (2006.01)

(52) U.S. Cl.
CPC ............ *H01L 28/20* (2013.01); *H01L 31/107* (2013.01); *G01J 2001/4466* (2013.01)

(56) References Cited

U.S. PATENT DOCUMENTS

| | | |
|---|---|---|
| 2013/0099100 A1 | 4/2013 | Pavlov |
| 2014/0183684 A1 | 7/2014 | Sadygov et al. |
| 2015/0041627 A1 | 2/2015 | Webster |
| 2015/0380457 A1* | 12/2015 | Fujii .................. G01T 1/241 378/19 |
| 2016/0079464 A1 | 3/2016 | Sasaki et al. |
| 2016/0181302 A1 | 6/2016 | McGarvey et al. |

\* cited by examiner

SEMICONDUCTOR PHOTOMULTIPLIER

RELATED CROSS-REFERENCED APPLICATION

This application is a divisional of U.S. patent application Ser. No. 14/577,123, filed Dec. 19, 2014, which application is herein incorporated in its entirety by this reference. Related subject matter is found in a co-pending patent application entitled "Semiconductor Photomultiplier", U.S. patent application Ser. No. 15/582,158, filed Apr. 28, 2017, invented by Brian McGarvey, Stephen John Bellis, and John Carlton Jackson and assigned to the assignee hereof.

FIELD OF THE INVENTION

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a substrate such as silicon. APD cells vary in dimension from several micron to 100 microns depending on the mask used, and can have a typical density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 100 to >1000V, typically. APDs exhibit internal current gain effect of about 100-1000 due to impact ionization, or avalanche effect, when a high reverse bias voltage is applied (approximately 100->200 V in silicon, depending on the doping profile in the junction). Silicon Photomultipliers or SiPMs can achieve a gain of $10^5$ to $10^6$ by using Geiger mode APDs also known as Single Photon Avalanche Diodes (SPADs) which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event. SiPM sensors have lower operating voltages than APDs and have a breakdown voltage from 10-100 Volts.

Silicon Photomultipliers typically include a matrix of major and minor bus lines. The minor bus lines connect directly to the microcells. The minor bus lines are then joined to bond pads by a major bus line. The minor bus lines are loaded with the inductance, capacitance and resistance of the microcells. The major bus lines are then loaded with the inductance, capacitance and resistance of the minor bus lines. The rise time, delay and recovery time of signal from a microcell on the SiPM will therefore depend strongly on its position in the SiPM. The variation in rise time and delay across the array will give rise to increased jitter and therefore increased coincidence resolving time (CRT) or timing jitter.

There is therefore a need to provide a semiconductor photomultiplier which addresses at least some of the drawbacks of the prior art.

SUMMARY

In one aspect, there is provided a semiconductor photomultiplier comprising:
  a substrate;
  an array of photosensitive elements formed on a first major surface of the substrate;
  a plurality of primary bus lines interconnecting the photosensitive elements;
  at least one segmented secondary bus line provided on a second major surface of the substrate which is operably coupled to one or more terminals; and
  multiple vertical interconnect access (vias) extending through the substrate operably coupling the primary bus lines to the at least one segmented secondary bus line.

In another aspect, the photosensitive element comprises a single photon avalanche diode (SPAD).

In a further aspect, a quench element is associated with each SPAD. Advantageously, the quench element is a passive component resistor. Preferably, the quench element is an active component transistor.

In one aspect, each segment of the segmented secondary bus line has an associated via coupled to a corresponding primary bus line.

In a further aspect, each photosensitive element is part of a microcell.

In another aspect, at least some of the segments of the segmented secondary bus line are of equal length in order to equalise the signal delays from the microcells to the one or more terminals.

In a further aspect, the length of at least some of the primary bus lines are of equal length in order to equalise the signal delays from the microcells to the one or more terminals.

In one aspect, each microcell comprises a photodiode. Advantageously, each microcell comprises a resistor coupled in series to the photodiode. Preferably, a capacitive element is provided.

In another aspect, the interconnected photosensitive elements are arranged in a grid configuration.

In a further aspect, the primary buses lines are parallel to columns in the grid configuration. Advantageously, at least some of the primary bus lines extend between the columns.

In another aspect, the primary and secondary bus lines are perpendicular to each other. Advantageously, each photosensitive element comprises an avalanche photodiode or a single photon avalanche diode.

In one aspect, each interconnected photosensitive element comprises a quench resistor coupled in series to the avalanche photodiode or a single photon avalanche diode.

The present disclosure relates to a substrate comprising:

an array of photosensitive elements formed on a first major surface of the substrate;

a plurality of primary bus lines interconnecting the photosensitive elements;

at least one segmented secondary bus line provided on a second major surface of the substrate which is operably coupled to one or more terminals; and multiple vertical interconnect access (vias) extending through the substrate operably coupling the primary bus lines to the at least one segmented secondary bus line.

The present disclosure also relates to a method of fabricating a semiconductor photomultiplier; the method comprising:

forming an array of photosensitive elements on a first major surface of a substrate;

providing a plurality of primary bus lines interconnecting the photosensitive elements;

providing at least one segmented secondary bus line on a second major surface of the substrate which is operably coupled to one or more terminals; and providing multiple vertical interconnect access (vias) extending through the substrate operably coupling the primary bus lines to the at least one segmented secondary bus line.

These and other problems are addressed by providing a semiconductor photomultiplier having primary and secondary bus lines on respective opposite sides of the substrate interconnected by vertical interconnect access (via).

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
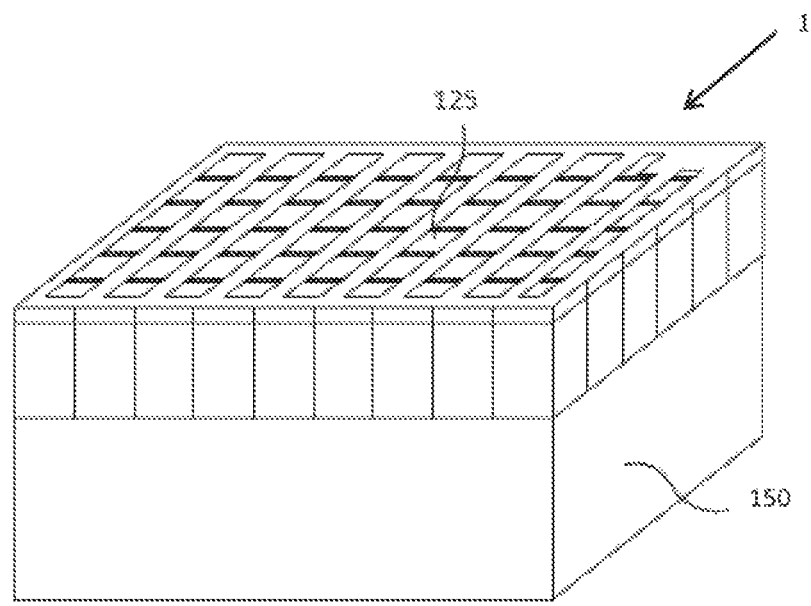
FIG. 1 illustrates an exemplary structure of a silicon photomultiplier.

The present disclosure will now be described with reference to some exemplary semiconductor photomultipliers. It will be understood that the exemplary semiconductor photomultipliers are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Referring initially to FIG. 1, a silicon photomultiplier 100 comprising an array of Geiger mode photodiodes is shown. The array is formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode. A quench resistor is provided adjacent to each photodiode which may be used to limit the avalanche current. The photodiodes are electrically connected to common biasing and ground electrodes by aluminium or similar conductive tracking.

Figure 2:
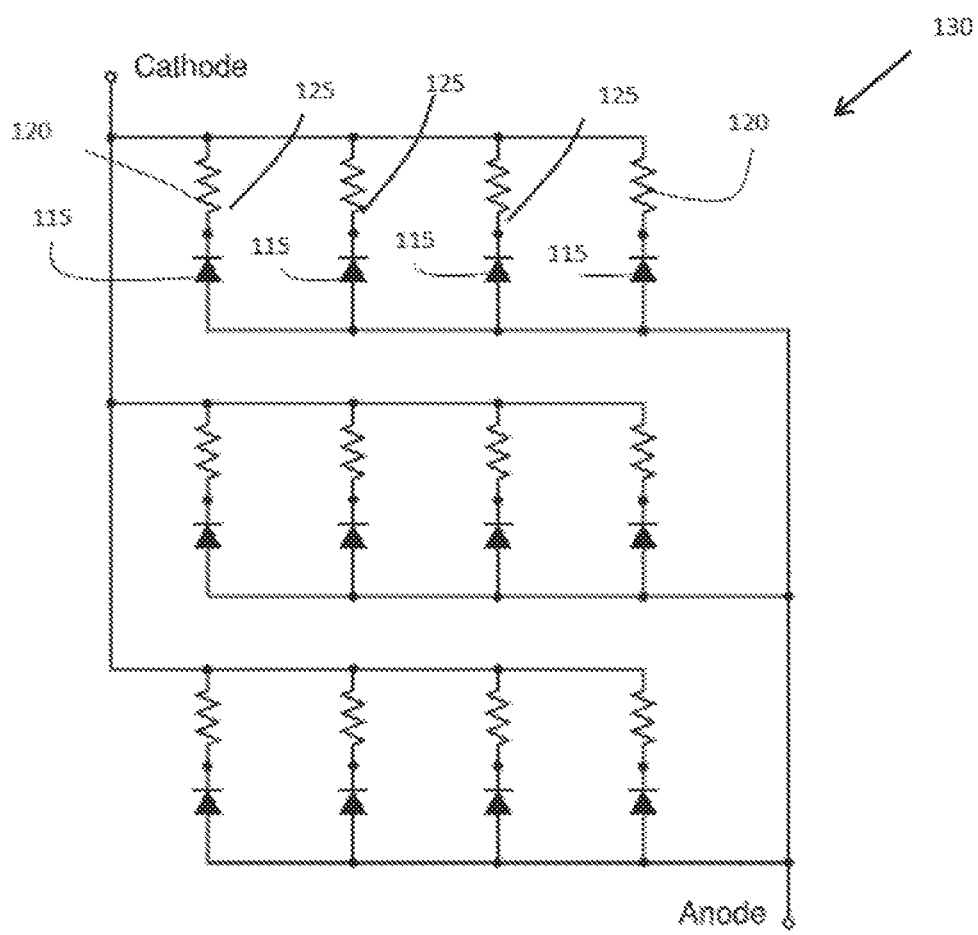
FIG. 2 is a schematic circuit diagram of an exemplary silicon photomultiplier.

The Silicon Photomultiplier 100 integrates a dense array of small, electrically and optically isolated Geigermode photodiodes 115. Each photodiode 115 is coupled in series to a quench resistor 120. Each photodiode 115 and its associated quench resistor 120 are referred to as a microcell 125. The number of microcells 125 typically number between 100 and 3000 per $mm^2$. The signals of all microcells 125 are then summed to form the output of the SiPM 100. A simplified electrical circuit 130 is provided to illustrate the concept in FIG. 2. Each microcell 125 detects photons identically and independently. The sum of the discharge currents from each of these individual binary detectors combines to form a quasi-analog output, and is thus capable of giving information on the magnitude of an incident photon flux.

Each microcell 125 generates a highly uniform and quantized amount of charge every time the microcell 125 undergoes a Geiger breakdown. The gain of a microcell 125 (and hence the detector) is defined as the ratio of the output charge to the charge on an electron. The output charge can be calculated from the over-voltage and the microcell capacitance.

$$G = \frac{C \cdot \Delta V}{q}$$

Where:
G is the gain of the microcell;
C is the capacitance of the microcell;
$\Delta V$ is the over-voltage; and
q is the charge of an electron.

Figure 3:
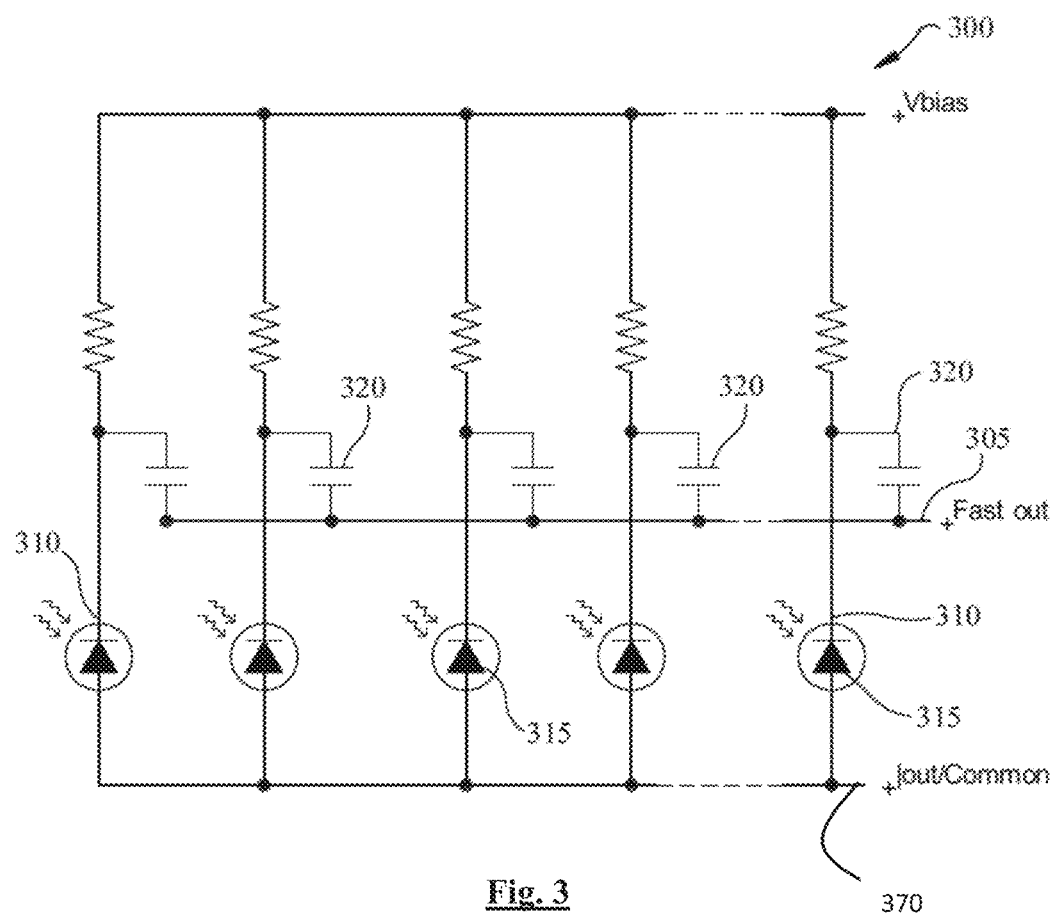
FIG. 3 is a schematic circuit diagram of an exemplary silicon photomultiplier.

Referring now to FIG. 3 which illustrates a silicon photomultiplier 300 described in PCT Patent Application no.

WO 2011/117309 of which the present assignee is the applicant, the contents are incorporated herein by reference. The SPM 300 has a third electrode 305 which is capacitively coupled to each photodiode cathode 310 in order to provide a fast readout of the avalanche signals from the photodiodes 315. When the photodiode 315 emits a current pulse, part of the resulting change in voltage at the cathode 310 will be coupled via mutual capacitance 320 into the third (fast) electrode 305. Using the third electrode 305 for readout avoids the compromised transient performance resulting from the relatively large RC time constant associated with the biasing circuit.

Figure 4:
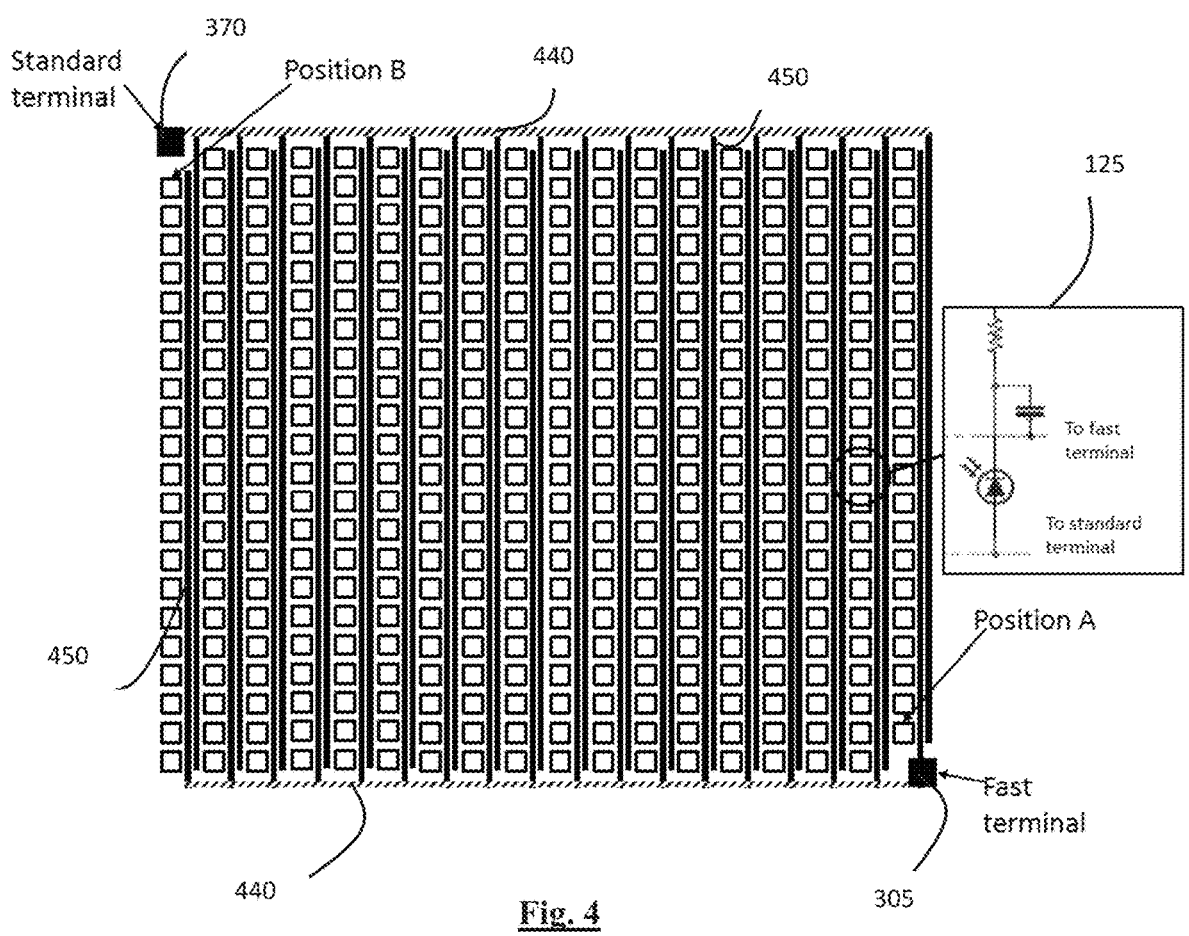
FIG. 4 is a top plan view of an exemplary silicon photomultiplier.

It will be appreciated by those skilled in the art that silicon photomultipliers comprise major bus lines 440 and minor bus lines 450 as illustrated in FIG. 4. In silicon photomultipliers know heretofore the minor bus lines 450 connect directly to the microcells 125. The minor bus lines 450 are then coupled to major bus line 440 which connect to the bond pads associated with the terminals 370 and 305. Typically, the minor bus lines 450 extend vertically between the columns of microcells 125; while the major bus lines 440 extend horizontally adjacent the outer row of the microcells 125. The minor bus lines 450 are loaded with the inductance, capacitance and resistance of the microcells 125. The major bus lines 440 are then loaded with the inductance, capacitance and resistance of the minor bus lines 450. The rise time, delay and recovery time of signal from a microcell 125 on the SiPM will therefore depend significantly on its position in the SiPM. The variation in rise time and delay across the array will give rise to increased jitter and therefore increased coincidence resolving time (CRT). It will be appreciated by those skilled in the art that a microcell 125 firing at position A will have a very different signal path to microcell 125 firing at position B. The rise time and delay of the signal will be different as the signal path is not uniform. The range of these parameters impacts coincidence resolving time (CRT) significantly.

Figure 5:
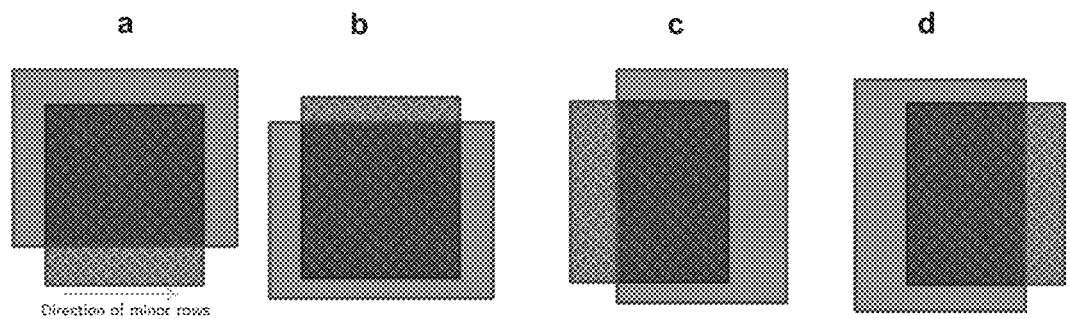
FIG. 5 is a diagrammatic view of four microcells.
Figure 6:
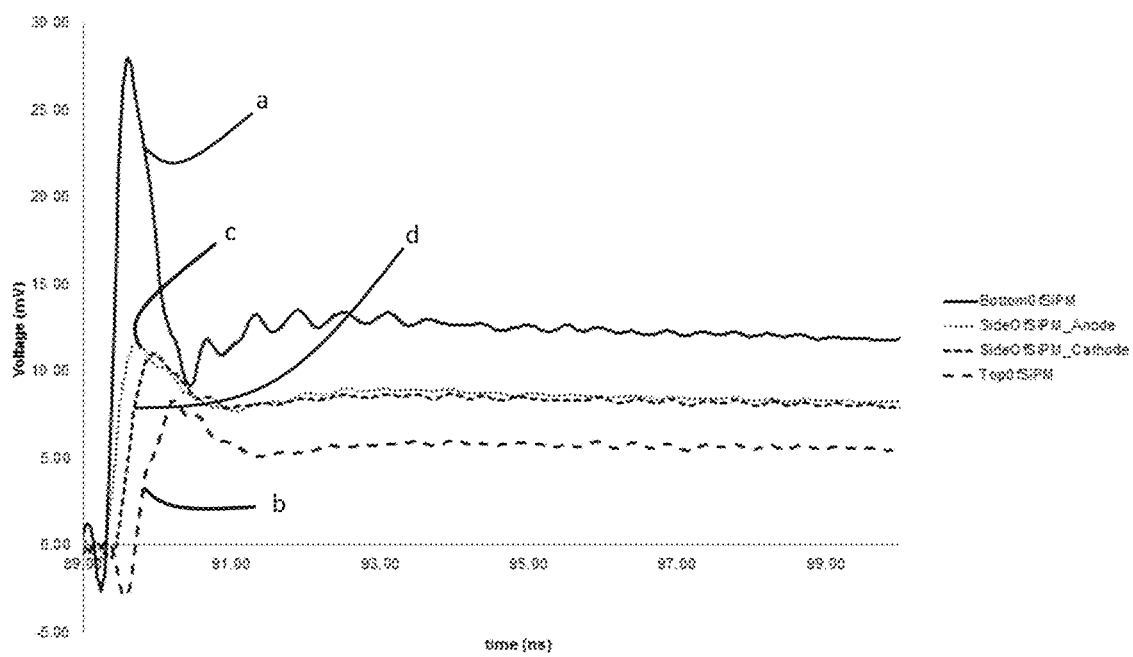
FIG. 6 is a graph showing that signal delay, rise time and overall shape depend on the position of the microcell.

Referring now to FIGS. 5 and 6, which shows experimental data to quantify the range of delays and rise times seen across a SiPM. Pulses coming from different areas of the SiPM were compared by partially (85%) blacking out areas as indicated by labels a, b, c, and d in FIG. 5.
a) The minor rows closest to the anode were exposed. The signal path along the major row is short.
b) The minor rows at the end of the major rows were exposed. This is the opposite of (a). The signal path along the major row will be long.
c) The microcells on the minor bus closest to the major bus are exposed. The signal path along the minor rows will be short.
d) The micro cells on the minor bus furthest from the major row are exposed. The signal path along the minor rows will be long.

Figure 7:
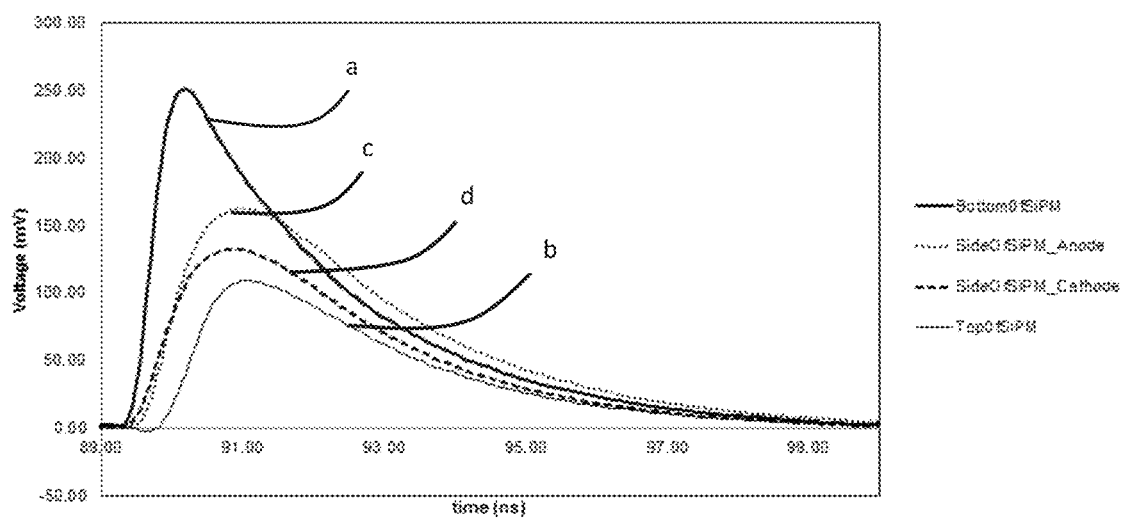
FIG. 7 is a graph showing that signal delay, rise time and overall shape depend on the position of the microcell.
Figure 8:
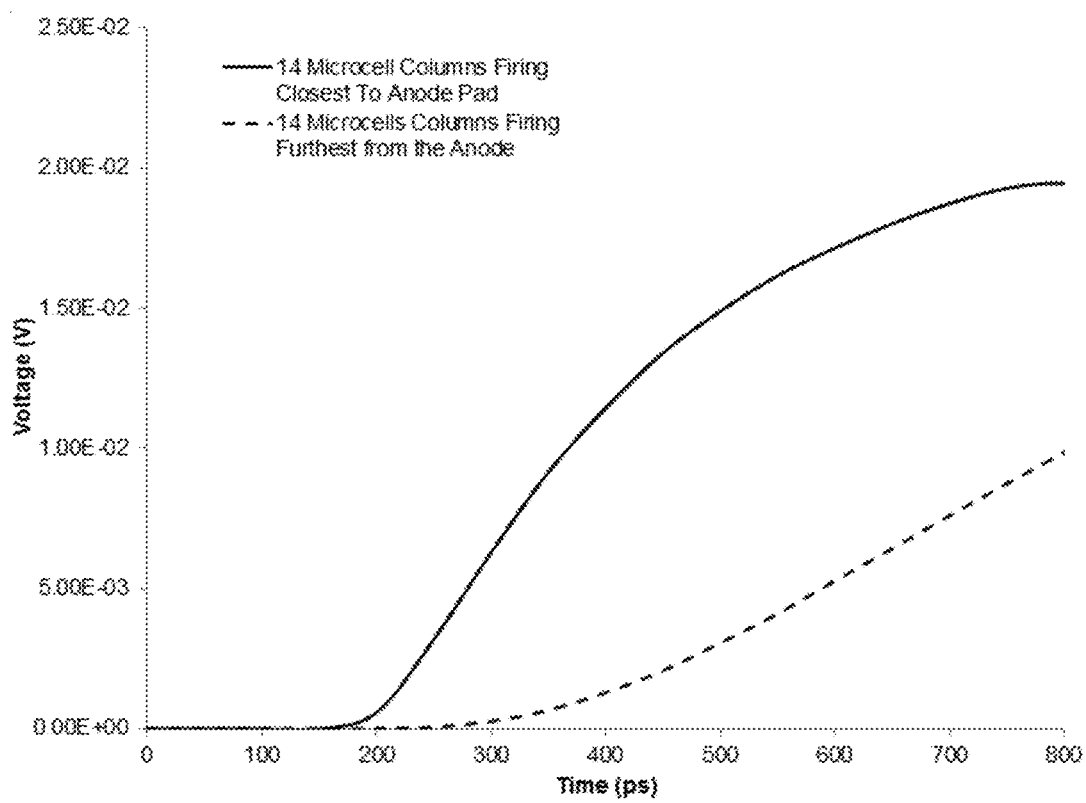
FIG. 8 is a graph which shows the signal from the microcells furthest from the major row (furthest from terminal) compared with the signal from those closest to it.

It is clear from the graphs in FIGS. 6 and 7 that the standard terminal 370 and fast output terminal 305 signal delay, rise time and overall shape depend strongly on position on the major row. FIG. 6 illustrates the signals measured at the standard terminal 370, while FIG. 7 illustrates the signals measured at the fast terminal 305. The delay from difference between 'a' and 'b' is approximately 400 ps. The graph of FIG. 8 shows the signal from fourteen microcells furthest from the major row (anode terminal) compared with the signal from fourteen microcells closest to major row (anode terminal). It is clear that there is significant time delay between the two signals. It is desirable to segment the major bus line in order to reduce the load on the signal. If the segments were joined together on top of the substrate 150, the area taken up by the additional bus lines would be subtracted from the optically active area, significantly reducing the photo-detection efficiency (PDE).

Figure 9:
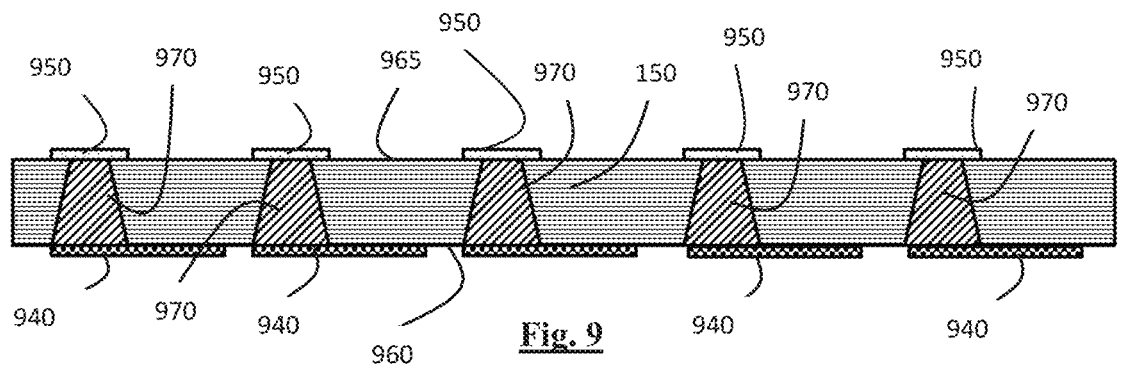
FIG. 9 shows a cross sectional view of a photomultiplier in accordance with the present teaching.
Figure 10:
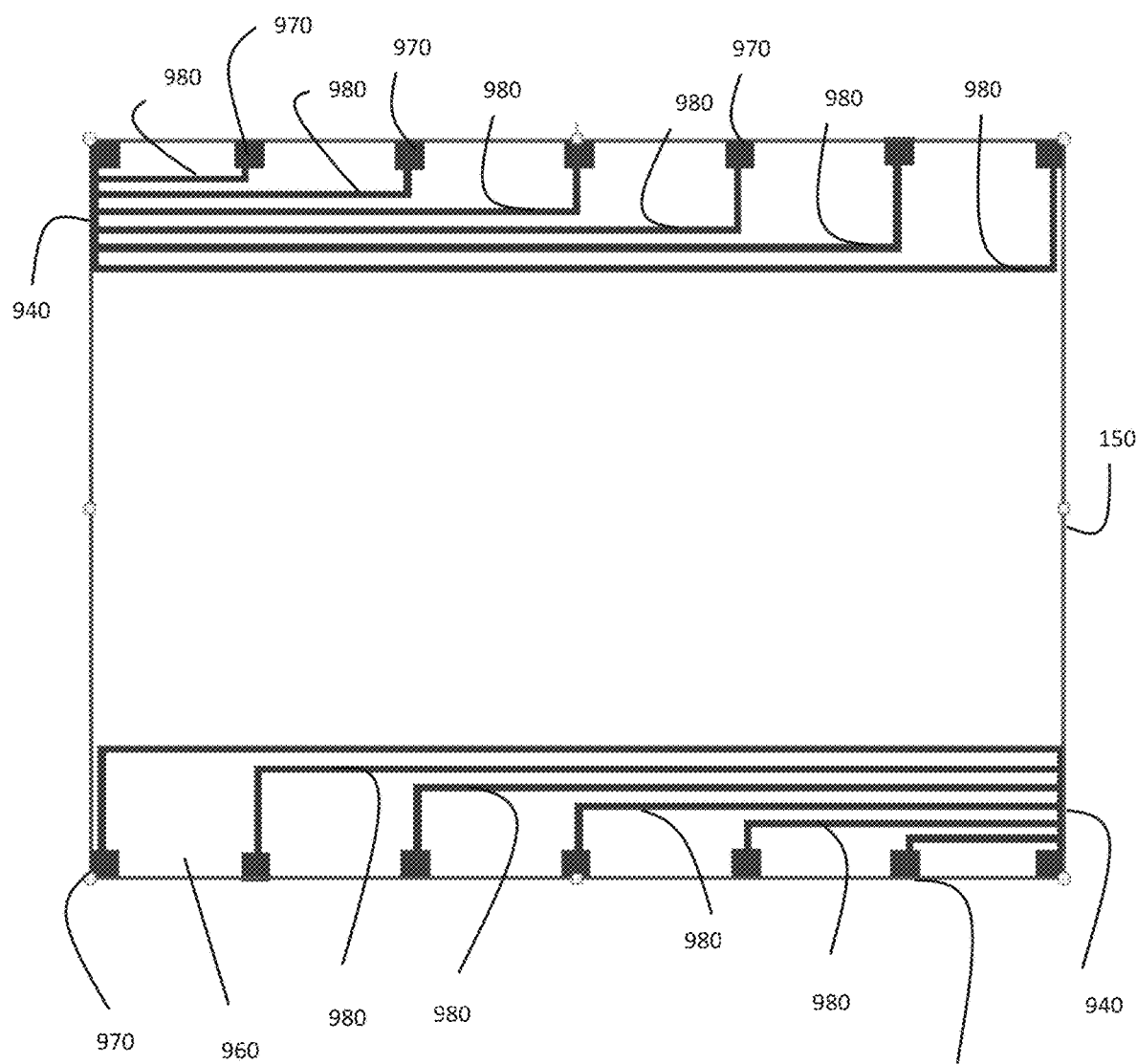
FIG. 10 is a plan view of a bottom surface of the photomultiplier of FIG. 9.

Referring now to FIGS. 9 and 10 which illustrates an exemplary layout of minor bus lines 950 and major bus lines 940 in accordance with the present teaching. The minor bus lines 950 extend vertically between the columns of microcells 125 similar as previously described with reference to FIG. 4. The major bus lines 940 are provided on a lower surface 960 of the substrate 150 and are operably coupled to the minor bus lines 950 via true silicon vias (TSVs) 970. The minor bus lines 950 interconnect the microcells 125 which are formed on an upper surface 965 of the substrate 150. The TSVs 970 are vertical connections which pass completely through the substrate 150. The number of major bus lines 940 which may be used is significantly increased compared to the arrangement of FIG. 4 because the area for accommodating the major bus lines 940 is not limited to the periphery of the upper major surface of the substrate 150. The full area of the bottom surface 960 of the substrate 150 is available to accommodate the major bus lines 940. The major bus line 940 is segmented into multiple segments 980 as illustrated in FIG. 10. In the exemplary, six segments 980 extend horizontally on the bottom surface 960 of the substrate 150. It is will be appreciated by those skilled in the art that the major bus line 940 may be segmented into any desirable number of segments 980. Routing the major bus lines 940 under the silicon substrate 150 minimises the impact on the optically active area of the SiPM. It will be clear to those skilled in the art that CRT is strongly dependent on the range of delay seen across the array of microcells in the SiPM. Reducing the range of delay by segmenting the major bus lines 940 will reduce CRT.

Figure 11:
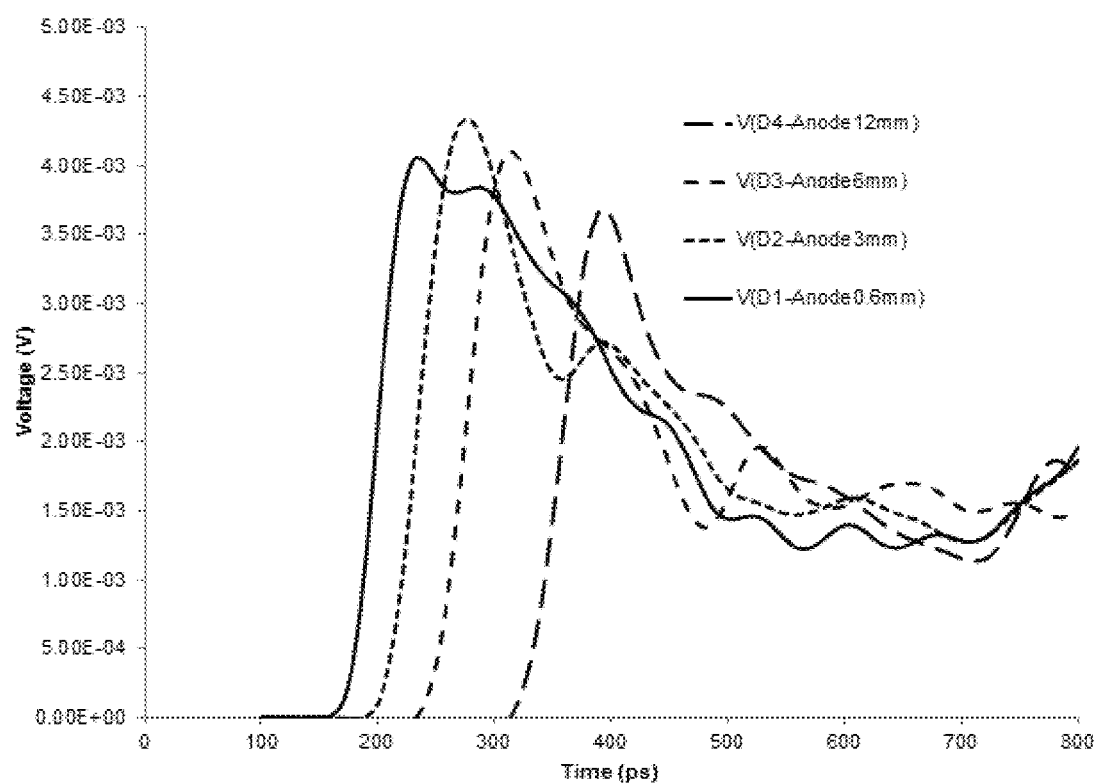
FIG. 11 is a simulated graph of the signals on a segmented bus line on the bottom surface of the photomultiplier of FIG. 9.

Referring now to the graph of FIG. 11 which is a simulated graph of the SiPM of FIG. 10 showing the signal delay, rise time and overall shape of the signal of four different segments connected to different major bus lengths (980). The signal delay between the fastest and slowest signal is approximately 150 ps. Thus making the major bus lengths equal under the silicon will reduce the delay range further, thereby reducing CRT. Such a scheme is illustrated in FIG. 13.

Figure 12:
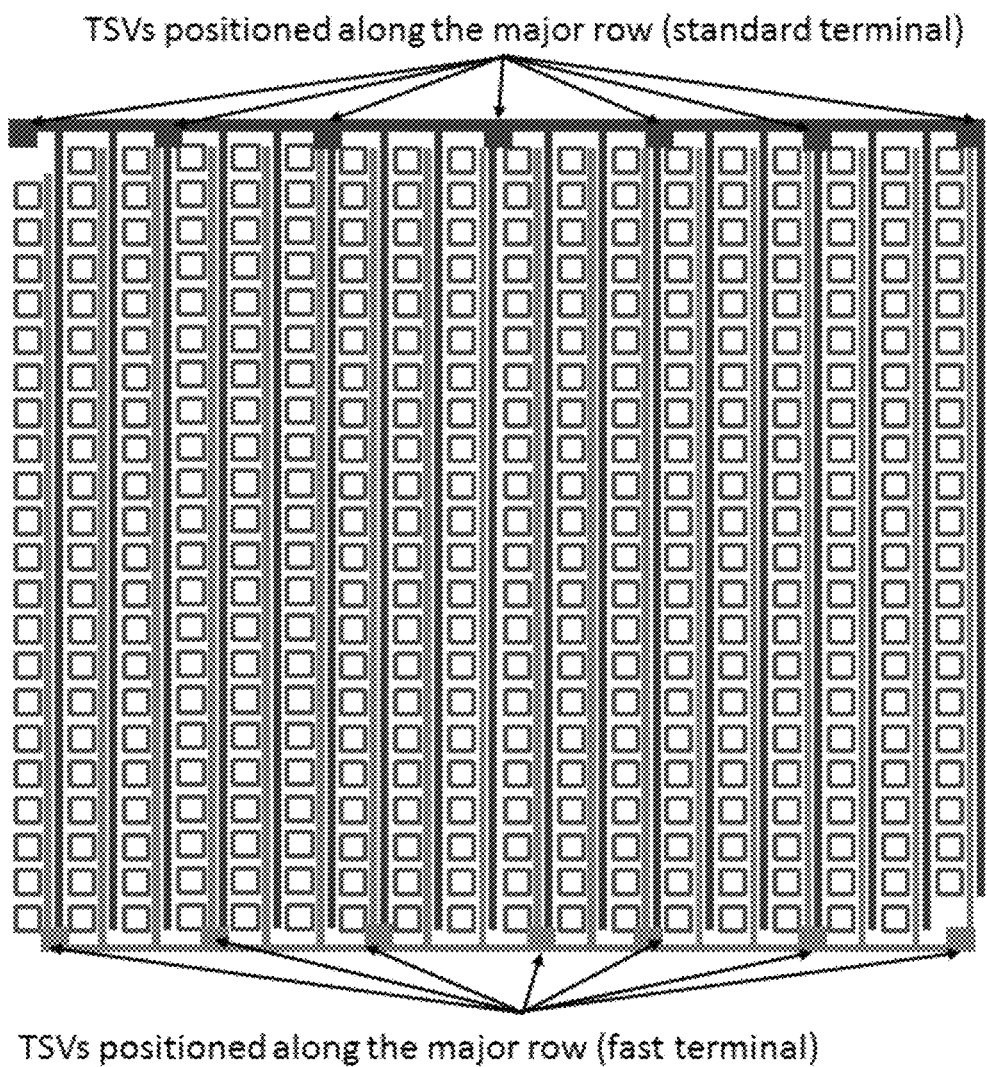
FIG. 12 is a diagrammatic illustration of primary and secondary bus lines of the photomultiplier in accordance with the present teaching.

Referring now to FIG. 12 which shows TSVs positioned along the major row associated with the standard terminal 370 and TSVs positioned along the major row associated with the fast terminal 305. Using TSVs allows the arrays of micro cells 125 on top surface 965 of the substrate 150 to be segmented so that the major rows are shorted. The major and minor rows may be connected to the under side of the substrate at various positions in the area of the die and shorted via copper tracks. This will effectively reduce the load on each segment of microcells 125. The reduced load will lead to a reduced range of delays (jitter and CRT). Further reductions in jitter can be achieved by using minor rows of various lengths so that the minor row load seen by a microcell furthest from the terminal is smallest and that seen by a microcell closest to the terminal is largest.

Figure 13:
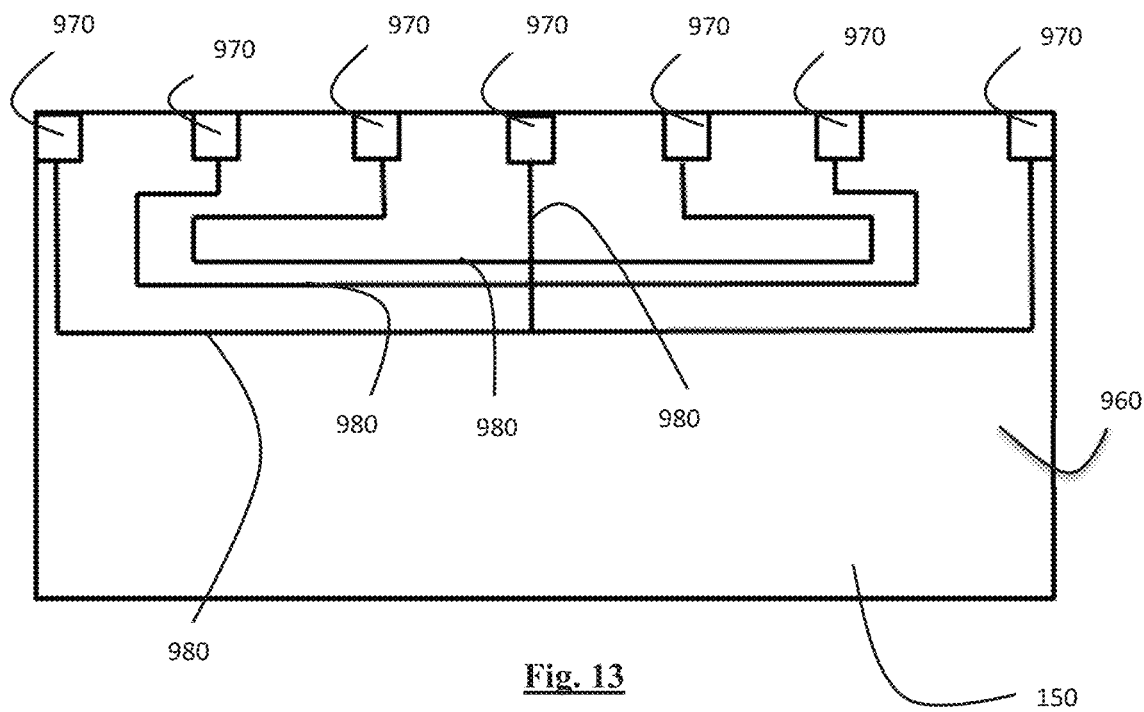
FIG. 13 is a plan view of a bottom surface of the photomultiplier in accordance with the present teaching.

Referring now to FIG. 13 there illustrated a segmented major bus line on the bottom surface 960 of the substrate 150. The major bus line is similar to the arrangement described in FIG. 10 with the exception that track length is increased in order to equalise the signal delays from the microcells 125 to the terminals. This is possible because due to the extra space under the substrate 150 to route the metal lines.

Figure 14:
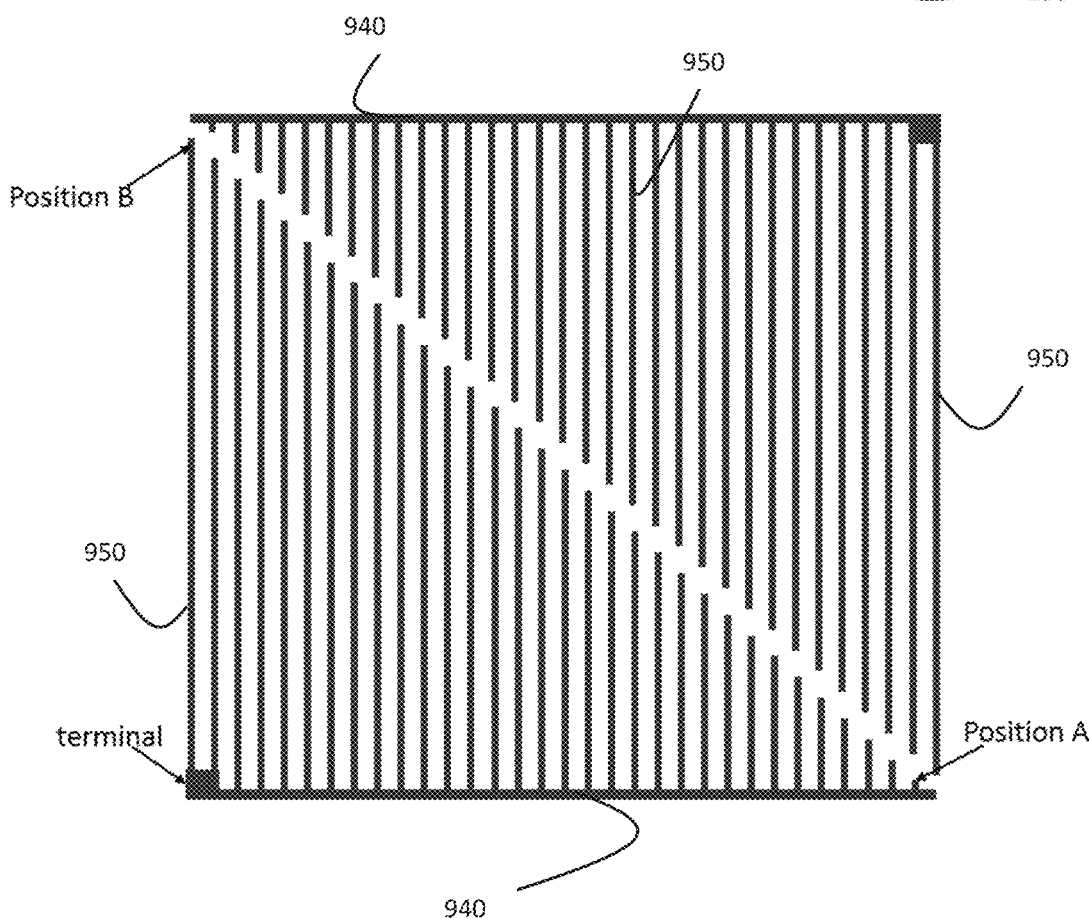
FIG. 14 is a diagrammatic illustration of primary and secondary bus lines of the photomultiplier in accordance with the present teaching.

Referring now to FIG. 14 there is illustrated an exemplary arrangement of the minor bus lines where the signal paths from the microcells to the terminals are equalised. For example, the signal path from position A to the terminal is approximately equal to signal path from position B. Such a scheme can be incorporated with the arrangement illustrated in FIGS. 9, 10, 12, 13 in order to further reduce the delay range.

It will be appreciated by those of ordinary skill in the art that the silicon photomultiplier of the present teaching may be fabricated on the substrate 150 using conventional semiconductor processing techniques and may include for example, but not limited to, deposition, implantation, diffusion, patterning, doping, and etching. Patterned layers of conducting material, insulating material and doped areas of semiconductor form the structure of the microcells.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier comprising:
   a semiconductor substrate;
   an array of microcells on an upper surface of the semiconductor substrate, wherein each microcell comprises a photosensitive element;
   a plurality of minor bus lines on the upper surface of the semiconductor substrate and extending vertically along columns of the microcells, wherein each minor bus line couples the microcells of a respective column together;
   a plurality of vias extending through the semiconductor substrate coupled to corresponding ones of the plurality of minor bus lines and coupling the plurality of minor bus lines to a bottom surface of the semiconductor substrate; and
   a major bus line provided on the bottom surface of the semiconductor substrate comprising a plurality of segments, wherein each segment is coupled to a corresponding one of the plurality of vias, and all of the segments are coupled to a terminal of the semiconductor photomultiplier,
   wherein the array of microcells, the plurality of minor bus lines, the plurality of vias, and the major bus line are fabricated on the semiconductor substrate using semiconductor processing techniques.

2. The semiconductor photomultiplier of claim 1, wherein the photosensitive element of each of the microcells comprises a single photon avalanche diode (SPAD).

3. The semiconductor photomultiplier of claim 2, wherein the photosensitive element of each of the microcells further comprises a quench element associated with the SPAD.

4. The semiconductor photomultiplier of claim 3, wherein the quench element comprises a resistor.

5. The semiconductor photomultiplier of claim 1, wherein at least some of the plurality of segments of the major bus line are of equal length in order to equalize signal delays from the microcells to the terminal.

6. The semiconductor photomultiplier of claim 1, wherein the photosensitive element of each of the microcells comprises a photodiode.

7. The semiconductor photomultiplier of claim 6, wherein the photosensitive element of each of the microcells further comprises a quench element coupled to the photodiode.

8. The semiconductor photomultiplier of claim 7, wherein the quench element comprises a resistor.

9. The semiconductor photomultiplier of claim 6, further comprising a capacitive element coupled between each photodiode and the terminal.

10. A semiconductor photomultiplier comprising:
    a semiconductor substrate;
    an array of microcells on an upper surface of the semiconductor substrate, wherein each microcell comprises a photosensitive element;
    a first plurality of minor bus lines on the upper surface of the semiconductor substrate and extending vertically along columns of the microcells, wherein each of the first plurality of minor bus lines couples the microcells of a respective column together;
    a first major bus line on the upper surface and extending horizontally adjacent a first outer row of the microcells and coupling to each of the first plurality of minor bus lines on the upper surface;
    a first plurality of vias extending through the semiconductor substrate coupled to the first major bus line and coupling the first major bus line on the upper surface to a bottom surface of the semiconductor substrate; and
    a second major bus line formed on the bottom surface of the semiconductor substrate coupled to the first plurality of vias and comprising a plurality of segments providing corresponding track lengths that equalize signal delays from the microcells to a first terminal of the semiconductor photomultiplier,
    wherein the array of microcells, the first plurality of minor bus lines, the first major bus line, the first plurality of vias, and the second major bus line are fabricated on the semiconductor substrate using semiconductor processing techniques.

11. The semiconductor photomultiplier of claim 10, wherein the first terminal comprises a fast readout terminal.

12. The semiconductor photomultiplier of claim 11, wherein each of the microcells further comprises a quench element coupled to the photosensitive element.

13. The semiconductor photomultiplier of claim 12, wherein the quench element comprises a resistor.

14. The semiconductor photomultiplier of claim 10, further comprising
    a second plurality of minor bus lines on the upper surface of the semiconductor substrate and extending vertically along columns of the microcells, wherein each of the second plurality of minor bus lines couples the microcells of a respective column together;
    a third major bus line on the upper surface and extending horizontally adjacent a second outer row of the microcells and coupling to each of the second plurality of minor bus lines on the upper surface;
    a second plurality of vias extending through the semiconductor substrate coupled to the second major bus line on the upper surface and coupling the second major bus line on the upper surface to the bottom surface of the semiconductor substrate; and
    a fourth major bus line formed on the bottom surface of the semiconductor substrate coupled to the second plurality of vias and comprising a plurality of segments providing corresponding track lengths that equalize signal delays from the microcells to a second terminal of the semiconductor photomultiplier.

15. The semiconductor photomultiplier of claim 14, wherein the second terminal comprises a common terminal.

16. The semiconductor photomultiplier of claim 15, wherein:
- the photosensitive element of each of the microcells comprises a photodiode having an anode coupled to a corresponding one of the second plurality of minor bus lines, and a cathode; and
- each microcell further comprises a quench element having a first terminal coupled to the cathode of the photodiode, and a second terminal coupled to a bias terminal.

17. The semiconductor photomultiplier of claim 16, wherein the quench element comprises a resistor.

* * * * *